United States Patent
Yoganandan et al.

(10) Patent No.: US 11,209,937 B2
(45) Date of Patent: Dec. 28, 2021

(54) ERROR CORRECTION FOR SEAMLESS TRANSITION BETWEEN HOVER AND TOUCH SENSING

(71) Applicant: Samsung Electronics Co., Ltd., Suwon-si (KR)

(72) Inventors: Arun Rakesh Yoganandan, San Francisco, CA (US); Jee Hoon Kim, Cupertino, CA (US); Chang Long Zhu Jin, San Mateo, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/505,005

(22) Filed: Jul. 8, 2019

(65) Prior Publication Data

US 2021/0011604 A1    Jan. 14, 2021

(51) Int. Cl.
*G06F 3/044* (2006.01)
*G06F 3/041* (2006.01)
*H03K 17/955* (2006.01)

(52) U.S. Cl.
CPC .......... *G06F 3/04186* (2019.05); *G06F 3/044* (2013.01); *H03K 17/955* (2013.01)

(58) Field of Classification Search
CPC .... G06F 3/04186; G06F 3/044; H03K 17/955
See application file for complete search history.

(56) References Cited

U.S. PATENT DOCUMENTS

| 8,576,181 | B2  |   | 11/2013 | Cho |            |
|-----------|-----|---|---------|-----|------------|
| 9,619,567 | B2  | * | 4/2017  | Roundtree | G06Q 30/0207 |
| 2006/0214926 | A1 |   | 9/2006  | Kolmykov-Zotov et al. |    |
| 2012/0299848 | A1 | * | 11/2012 | Homma | G06F 3/0488 |
|           |     |   |         |     | 345/173    |
| 2012/0299849 | A1 |   | 11/2012 | Homma et al. |        |
| 2014/0085202 | A1 | * | 3/2014  | Hamalainen | G06F 3/013 |
|           |     |   |         |     | 345/158    |
| 2014/0240260 | A1 |   | 8/2014  | Park et al. |          |
| 2015/0049055 | A1 |   | 2/2015  | Post et al. |          |

(Continued)

FOREIGN PATENT DOCUMENTS

KR    20110061235 A    6/2011

OTHER PUBLICATIONS

European Search Report dated Nov. 26, 2020 in connection with European Patent Application No. 20 18 1585, 9 pages.

*Primary Examiner* — Towfiq Elahi

(57) ABSTRACT

A hover touch controller device includes a touch sensor having a touch surface and a proximity sensor. The touch sensor provides two-dimensional position information on when and where a user's finger touches the touch surface. The proximity sensor provides three-dimensional position information on pre-touch events. The pre-touch events corresponding to the user's finger hovering over the touch surface within some maximum depth. The hover touch controller device further includes a processor. The processor determines from the three-dimensional information a hover point projected on the touch surface and determines from the two-dimensional information a touch point on the touch surface. The processor communicates the hover point and the contact point to a display device. This can include correcting for any perceived user interaction issues associated an offset between the hover point and the touch point.

19 Claims, 8 Drawing Sheets

(56) References Cited

U.S. PATENT DOCUMENTS

| | | |
|---|---|---|
| 2015/0109257 A1 | 4/2015 | Jalali |
| 2015/0301642 A1* | 10/2015 | Hanauer ............. G06F 3/04166 345/174 |
| 2016/0378212 A1* | 12/2016 | Kim ...................... G06F 3/0416 345/173 |
| 2018/0004297 A1* | 1/2018 | Xu .......................... G06F 3/011 |

* cited by examiner

ERROR CORRECTION FOR SEAMLESS TRANSITION BETWEEN HOVER AND TOUCH SENSING

TECHNICAL FIELD

This disclosure relates generally to an electronic device with a hover touch capability, and more particularly, utilizing a hover touch controller device to communicate spatial input to a display device.

BACKGROUND

A variety of displays of varying forms and sizes can limit the user interface interactions that they support. In particular, many types of direct touch interactions are not supported by a variety of displays. For example, television monitors and Head Mounted Displays (HMDs) are not well suited for direct touch interaction, such as due to proximity. Televisions are typically viewed at a comfortable viewing distance away from the user. This distance is typically too far away from the user to allow direct touch interaction with the television. In contrast to a television, the display of an HMD is typically viewed at a distance that is in close proximity to the user's face. This distance is typically too near the user to allow direct touch interaction with the display of HMD. In a Virtual Reality (VR) environment, wearing a HMD may further prevent the user from directly seeing their hands or handheld input devices. This severely limits the variety and quality of interactions that the user can perform. Even when the user's hands are visible in Augmented Reality (AR) and Mixed Reality (MR) goggles, performing all virtual world interactions with free hand gestures is cumbersome. For example, alphanumeric input is especially difficult to perform with free hand input.

The alternatives to direct on-screen touch input also have limitations. For example, while traditional remote controllers and game controllers may have buttons, d-pads, knobs, joysticks and other physical input elements suitable for simple tasks these inputs are typically not well suited for direct spatial input. Touch remotes, while small, are not suitable for direct spatial selection because the user does not know where they are going to touch, until they make their first touch. While remotes with motion tracked input allow orientation and/or position to be used as inputs they perform poorly with alpha numeric and textual inputs. While second screen devices may be used as digital remote controls and input devices for displays, they divide the user's attention between screens adversely affecting the viewing experience.

In contrast, to the traditional controllers described above, a hover touch controller device is better suited to be an alternative to direct on-screen touch input. The hover touch controller device includes a touch sensor and a proximity sensor. Information on when and where a user touches the surface of the touch sensor is detected. Additionally, information on pre-touch events is detected. The pre-touch events correspond to a user's finger hovering over the touch sensor within some maximum depth. A display device generates visualizations based on the hover events and the touch events. This can include providing visual feedback in a hover mode where a user's finger is, relative to the touch sensor. However, current hover touch controller devices exhibit issues with user input perception that need to be addressed to fully exploit their potent.

SUMMARY

Embodiments of the present disclosure provide correction for perceived user interaction issues associated with an offset between a hover point and a touch point of a hover touch controller device.

In one embodiment, an apparatus for communicating spatial input is provided. The apparatus includes a touch surface, a proximity sensor configured to provide three-dimensional position information associated with an interactive device hovering over the touch surface, and a touch sensor configured to provide two-dimensional position information associated with the interactive device touching the touch surface. The apparatus further includes a processor configured to determine from the three-dimensional position information a hover point projected on the touch surface and determine from the two-dimensional position information a touch point, the touch point having an offset from the hover point, and correct for the offset and communicate a corrected position of the touch point to a display device.

In another embodiment, a method for communicating with an interactive device is provided. The method includes receiving three-dimensional position information from a proximity sensor describing an interactive device hovering over a touch surface of a hover touch controller device and receiving two-dimensional position information from a touch sensor describing the interactive device touching the touch surface. The method further includes determining from the three-dimensional position information a hover point projected on the touch surface and determining from the two-dimensional position information a touch point on the touch surface. The method also includes monitoring for an offset between the hover point and the touch point and responsive to identifying the touch point being offset from the hover point correcting for the offset and communicating a corrected position of the touch point to a display device.

In yet another embodiment, a computer program product residing on a non-transitory computer-readable storage medium having a plurality of instructions stored thereon which, when executed by a processor, cause the processor to communicate with an interactive device which include receiving three-dimensional position information from a proximity sensor describing an interactive device hovering over a touch surface of a hover touch controller device and receiving two-dimensional position information from a touch sensor describing the interactive device touching the touch surface. The computer program product further causes the processor to determine, from the three-dimensional position information, a hover point projected on the touch surface and determine, from the two-dimensional position information, a touch point on the touch surface. The computer program product also causes the processor monitor for an offset between the hover point and the touch point and responsive to identifying the touch point being offset from the hover point correct for the offset and communicate a corrected position of the touch point to a display device.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIG. 1 through FIG. 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Embodiments of the present disclosure provide for a hover touch controller device that includes a touch sensor having a touch surface and a proximity sensor. The touch sensor provides two-dimensional position information on when and where a user's finger touches the touch surface. The proximity sensor provides three-dimensional position information on pre-touch events. The pre-touch events corresponding to the user's finger hovering over the touch surface within some maximum depth. The hover touch controller device further includes a processor. The processor determines from the three-dimensional information a hover point projected on the touch surface and determines from the two-dimensional information a touch point on the touch surface. The processor communicates the hover point and the contact point to a display device. This can include correcting for any perceived user interaction issues associated an offset between the hover point and the touch point.

Figure 1:
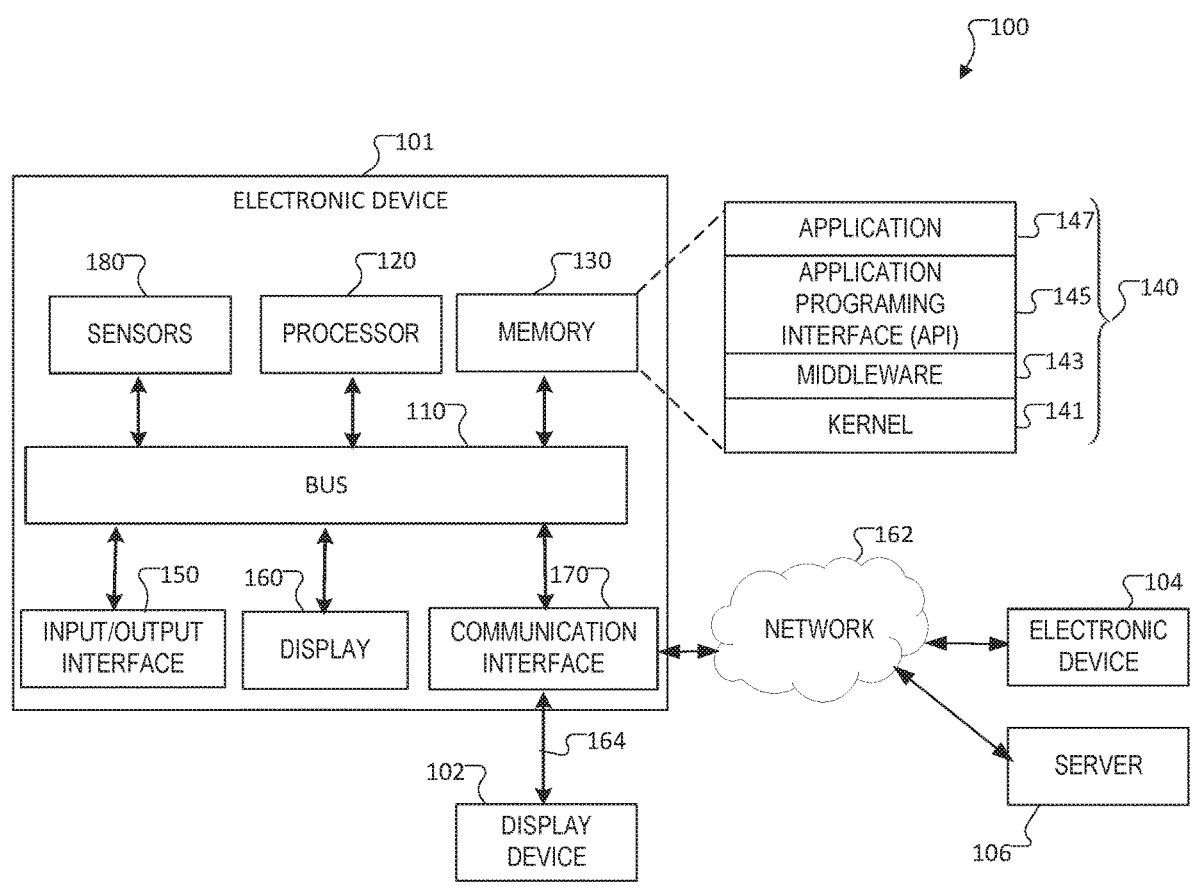
FIG. 1 illustrates an example of electronic device according to an embodiment of this disclosure.

FIG. 1 illustrates an example electronic device in a network environment 100 according to various embodiments of the present disclosure. The embodiment of the electronic device 101 and the network environment 100 shown in FIG. 1 is for illustration only. Other embodiments of the electronic device 101 and network environment 100 could be used without departing from the scope of this disclosure.

According to an embodiment of the present disclosure, an electronic device 101 is included in a network environment 100. The electronic device can be coupled to a display device 102. The electronic device 101 can include at least one of a bus 110, a processor 120, a memory 130, an input/output (TO) interface 150, a display 160, a communication interface 170, or sensors 180. In some embodiments, the electronic device 101 can exclude at least one of the components or can add another component.

The bus 110 includes a circuit for connecting the components 120 to 170 with one another and transferring communications (e.g., control messages and/or data) between the components.

The processor 120 includes one or more of a central processing unit (CPU), an application processor (AP), or a communication processor (CP). The processor 120 is able to perform control on at least one of the other components of the electronic device 101, and/or perform an operation or data processing relating to communication.

The memory 130 can include a volatile and/or non-volatile memory. For example, the memory 130 can store commands or data related to at least one other component of the electronic device 101. In various embodiments, the memory 130 can store spatial map data that can include mapping information of a real environment such as the interior of an office building, mall, house, amusement park, neighborhood or any other real world or virtual world mapping information utilized by an application 147 on the electronic device 101. According to an embodiment of the present disclosure, the memory 130 stores software and/or a program 140. The program 140 includes, e.g., a kernel 141, middleware 143, an application programming interface (API) 145, and/or an application program (or "application") 147. At least a portion of the kernel 141, middleware 143, or API 145 can be denoted an operating system (OS).

For example, the kernel 141 can control or manage system resources (e.g., the bus 110, processor 120, or a memory 130) used to perform operations or functions implemented in other programs (e.g., the middleware 143, API 145, or application program 147). The kernel 141 provides an interface that allows the middleware 143, the API 145, or the application 147 to access the individual components of the electronic device 101 to control or manage the system resources.

The middleware 143 can function as a relay to allow the API 145 or the application 147 to communicate data with the kernel 141, for example. A plurality of applications 147 can be provided. The middleware 143 is able to control work requests received from the applications 147, e.g., by allocating the priority of using the system resources of the electronic device 101 (e.g., the bus 110, the processor 120, or the memory 130) to at least one of the plurality of applications 147.

The API 145 is an interface allowing the application 147 to control functions provided from the kernel 141 or the middleware 143. For example, the API 145 includes at least one interface or function (e.g., a command) for filing control, window control, image processing, or text control.

The IO interface 150 serve as an interface that can, e.g., transfer commands or data input from a user or other external devices to other component(s) of the electronic device 101. Further, the IO interface 150 can output commands or data received from other component(s) of the electronic device 101 to the user or the other external device.

The display 160 includes, e.g., a liquid crystal display (LCD), a light emitting diode (LED) display, an organic light emitting diode (OLED) display, or a microelectromechanical systems (MEMS) display, or an electronic paper display. The display 160 is able to display, e.g., various contents (e.g., text, images, videos, icons, or symbols) to the user. The display 160 can include a touchscreen and may receive, e.g., a touch, gesture, proximity or hovering input using an electronic pen or a body portion of the user.

For example, the communication interface 170 is able to set up communication between the electronic device 101 and an external electronic device (e.g., a display device 102, a second external electronic device 104, or a server 106). For example, the communication interface 170 can be connected with the network 162 or 164 through wireless or wired communication to communicate with the external electronic device. The communication interface 170 can be a wired or wireless transceiver or any other component for transmitting and receiving signals, such as video feeds or video streams. Additionally, the communication interface 170 can include a near field communication capability to perform a near field communication directly with another device, such as display device 102. For example, communication interface 170 can include a BLUETOOTH transceiver, a ZIGBEE transceiver, a WI-FI transceiver, and the like, a magnetic connection, or an optical communication. In certain embodiments, the display device 102 is coupled to the electronic device via a wired or wireline connection.

Electronic device 101 further includes one or more sensors 180 that can meter a physical quantity or detect an activation state of the electronic device 101 and convert metered or detected information into an electrical signal. For example, sensor 180 can include one or more buttons for touch input, a camera, a gesture sensor, a gyroscope or gyro sensor, an air pressure sensor, a magnetic sensor or magnetometer, an acceleration sensor or accelerometer, a depth or distance sensor, a grip sensor, a proximity sensor, a color sensor (e.g., a red green blue (RGB) sensor), a bio-physical sensor, a temperature sensor, a humidity sensor, an illumination sensor, an ultraviolet (UV) sensor, an electromyography (EMG) sensor, an electroencephalogram (EEG) sensor, an electrocardiogram (ECG) sensor, an infrared sensor (IR) sensor, an ultrasound sensor, an iris sensor, a fingerprint sensor, and the like. The sensor(s) 180 can further include a control circuit for controlling at least one of the sensors included therein. Any of these sensor(s) 180 can be located within the electronic device 101. A camera sensor 180 can capture a plurality of frames for a single image to be combined by the processor 120.

In certain embodiments, an external electronic device, such as a wearable device or an electronic device 101-mountable wearable device (e.g., an optical head mounted display (HMD)) is provided. When the electronic device 101 is mounted in the HMD, the electronic device 101 detects the mounting in the HMD and operates as a display device 102, such as in an immersive reality mode. In certain embodiments, the electronic device 101 detects the mounting in the HMD and operate in an immersive reality mode. When the electronic device 101 is mounted in the HMD, the electronic device 101 communicates with the HMD through the communication interface 170. The electronic device 101 can be directly connected with the HMD to communicate with the HMD without involving a separate network.

The wireless communication is able to uses a wireless communication medium, such as at least one of, e.g., long term evolution (LTE), long term evolution-advanced (LTE-A), 5th generation wireless system (5G), mm-wave or 60 GHz wireless communication, Wireless USB, code division multiple access (CDMA), wideband code division multiple access (WCDMA), universal mobile telecommunication system (UMTS), wireless broadband (WiBro), or global system for mobile communication (GSM), as a cellular communication protocol. The wired connection can include at least one of universal serial bus (USB), high definition multimedia interface (HDMI), recommended standard 232 (RS-232), or plain old telephone service (POTS).

The network 162 includes at least one of communication networks. Examples of communication include a computer network (e.g., local area network (LAN) or wide area network (WAN)), Internet, or a telephone network.

The external electronic devices 104 and server 106 each can be a device of the same or a different type from the electronic device 101. According to certain embodiments of the present disclosure, the server 106 includes a group of one or more servers. According to certain embodiments of the present disclosure, all or some of operations executed on the electronic device 101 can be executed on another or multiple other electronic devices (e.g., the electronic device 104 or server 106). According to certain embodiments of the present disclosure, when the electronic device 101 should perform some function or service automatically or at a request, the electronic device 101, instead of executing the function or service on its own or additionally, can request another device (e.g., electronic device 104 or server 106) to perform at least some functions associated therewith. The other electronic device (e.g., electronic device 104 or server 106) is able to execute the requested functions or additional functions and transfer a result of the execution to the electronic device 101. The electronic device 101 can provide a requested function or service by processing the received result as it is or additionally. To that end, a cloud computing, distributed computing, or client-server computing technique can be used, for example.

Although FIG. 1 shows that the electronic device 101 includes the communication interface 170 to communicate with the external electronic device 104 or server 106 via the network 162, the electronic device 101 can be independently operated without a separate communication function, according to an embodiment of the present disclosure.

The server 106 can support to drive the electronic device 101 by performing at least one of operations (or functions) implemented on the electronic device 101. For example, the server 106 can include a processing module or processor that may support the processor 120 implemented in the electronic device 101.

For example, the electronic device 101 can include an event processing module, such as within processor 120. The event processing module can process at least part of information obtained from other elements (e.g., the processor 120, the memory 130, the input/output interface 150, or the communication interface 170) and can provide the same to the user in various manners. The server event processing module can include at least one of the components of the event processing module and perform (or instead perform) at least one of the operations (or functions) conducted by the event processing module.

For example, according to an embodiment of the present disclosure, the event processing module processes information related to an event, which is generated while the electronic device 101 is mounted in a wearable device (e.g., as the display device 102) to function as a display apparatus and to operate in the immersive reality mode, to fit the immersive reality mode and display the processed information. When the event generated while operating in the immersive reality mode is an event related to running an application, the event processing module can block the running of the application or process the application to operate as a background application or process.

The event processing module can be separate from the processor 120 or at least a portion of the event processing module can be included or implemented in the processor 120 or at least one other module, or the overall function of the event processing module can be included or implemented in the processor 120 shown or another processor. The event processing module can perform operations according to embodiments of the present disclosure in interoperation with at least one program 140 stored in the memory 130.

Figure 2:
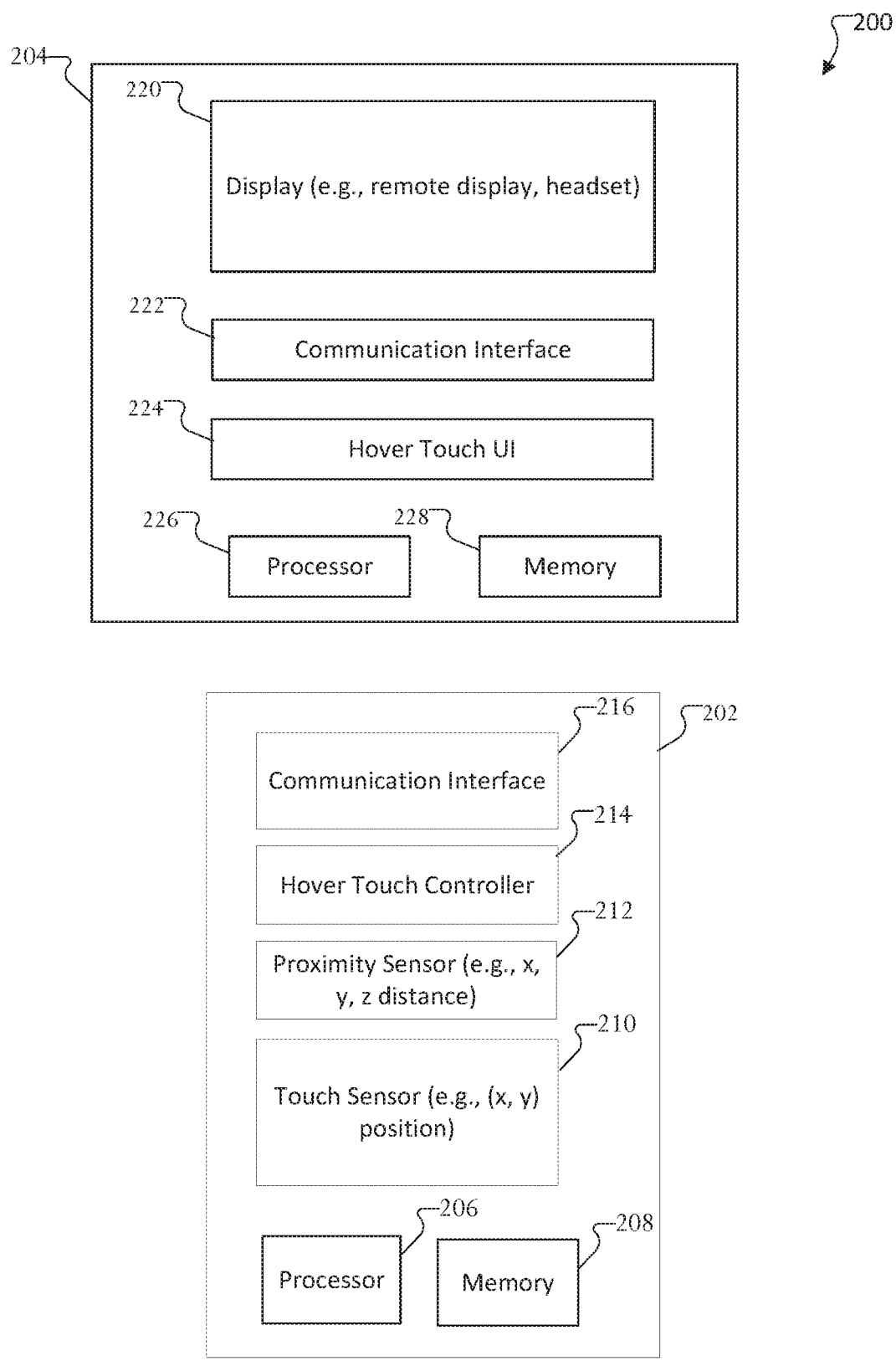
FIG. 2 illustrates a system configured to communicate spatial input to a display device in according to embodiments of the present disclosure.

FIG. 2 illustrates a system 200 configured to communicate spatial input to a display device according to embodiments of the present disclosure. The embodiment of the system 200 for communicating spatial input to a display device as shown in FIG. 2 is for illustration only. Other embodiments of the system 200 could be used without departing from the scope of this disclosure. In the example shown in FIG. 2, a hover touch controller device 202 is configured to communicate with a display device 204. In certain embodiments, the hover touch controller device 202 can be configured the same as, or similar to, electronic device 101. In certain embodiments, the display device 204 can be configured the same as, or similar to, the display device 102.

In certain embodiments, a hover touch controller device 202 includes at least one processor 206 and a memory 208. For example, the at least one processor 206 may include one or more computer processors, microprocessors, or a microcontroller. The memory 208 may include a data storage device supporting program instructions. The at least one processor 206 can be configured by the instructions to function as a special purpose processor to perform one or more methods described herein.

In certain embodiments, the hover touch controller device 202 includes a touch sensor 210 having a two-dimensional touch surface. The touch sensor 210 may provide two-dimensional (e.g., (x, y)) position information on a point of contact of an interaction device, such as a stylus, a user's finger, and the like, with the two-dimensional touch surface of the touch sensor 210. The touch sensor provides "touch" position information (a "touch mode") when an interaction device, such as a finger, touches down on the touch surface of the touch sensor.

The hover touch controller device 202 includes a proximity sensor 212 having a three-dimensional field. The proximity sensor 212 is configured to sense a position of an interaction device within a three-dimensional volume (e.g., a position that the user's finger hovers above the surface of the touch sensor 210). The proximity sensor 212 is able to provide three-dimensional (e.g., (x, y, z)) position information on when and where a finger or input device of a user is hovering around a touch surface of touch sensor 210 within a three-dimensional volume space above the touch sensor 210. This information may be described as "pre-touch" or a "hover" or "hover mode." For example, the user's finger may hover above the touch surface of the touch sensor prior to touching down on the touch surface of the touch sensor. A hover touch controller 214 coordinates the operation of the touch sensor 210 and proximity sensor 212 to generate information on the position of a user's finger relative to the touch surface.

The hover touch controller device 202 also includes a communication interface 216. The communication interface 216 includes a transmitter, receiver, or transceiver capable of transmitting or receiving communications from another device, such as display device 204. For example, the communication interface 216 can include a near field transceiver, such as a BLUETOOTH transceiver or ZIGBEE transceiver, a WI-FI transceiver, an optical interface, a magnetic interface, or the like. The communication interface 216 communicates "pre-touch" information to a display device 204.

In certain embodiments, the display device 204 is a remote display, such as a television or computer display. In certain embodiments, the display device 204 is another electronic device having a display, such as electronic device 104 or an HMD. In certain embodiments, the hover touch controller device 202 is coupled to, or included with, a headset display device. Additionally, in some embodiments, the hover touch controller device 202 is utilized in combination with another tracking device, such as a 6 degree of freedom tracker. The display device 204 includes a display 220, communication interface 222 configured to communicate with a hover touch controller device 202, hover touch user interface 224, a processor 226, and a memory 228.

The hover touch controller device 202 is an input device for a user to enter inputs for a display device 204. In embodiments in which it is used to control a remote display device, the hover touch controller device 202 may also be referred to as a "remote" such as a "remote control" for display device 204.

In some embodiments, the hover touch controller device 202 is used in combination with a head mounted display. It will also be understood that in some embodiments the hover touch device 202 may be connected to, attached to, or otherwise operated in combination with a head mounted display. For example, the hover touch device 202 may be collocated with, or disposed on, the front face of a head mounted display. In one embodiment, the hover touch controller device 202 is transparent, or substantially transparent, in order to enable it to be used with see through head mounted display. In some embodiments, the hover touch device 202 contains wireless modules and processing units of its own, which allows it to be detached from the head mounted display and used at a hand level. For example, the processor 206 may transmit the position of the interactive device wirelessly via a wireless interface such as BLUETOOTH, ZIGBEE or WI-FI to the head mounted display.

In some embodiments, the hover touch controller device 202 is configured to communicate three-dimensional position information to a cursor on an interactive surface of the remote display device 204. The cursor may be designed to provide a visual representation of the tracking information on the display. In certain embodiments, the cursor is configured to provide a visual representation of whether the interactive device is operating in the hover volume or the touch volume, so that the user can understand the distinct states of input associated with these interactive spaces and navigate accordingly. This cursor shows (x, y) movement of the interactive device with respect to touch surface of the hover touch controller device 202. For example, if the interactive device is at an (x, y) coordinate with respect to the touch surface of the touch sensor 210, a displaying of the hover touch cursor on the remote display device 204 would be situated at a corresponding position. In addition, in certain embodiments, a different color is associated with the cursor based on whether the interactive device is hovering over the touch surface or touching the touch surface. In certain embodiments, other visual indicators may be used instead of color. For example, the radius of a circle associated with the cursor may correspond directly with the proximity of the interactive device to the touch surface and thereby its z value. The cursor movement and transformation on the display device204 provides the user with comprehensive information about the interaction state of the interactive device with respect to the touch surface of the hover touch controller device 202. That is, the cursor provides a visualization that allows the user to see what objects on the interactive display are going to be touched before the object is touched. This removes a need for the user to look down at the hover touch controller device 202 or their hands and work efficiently by just looking at the remote display device 204. This could, for example, increase the speed of typing on the display.

In certain embodiments, the hover touch controller device 202 also includes a processor 206. The processor 206 is configured to differentiate between three-dimensional position information associated with the interactive device hovering over the touch surface and two-dimensional position information associated with the interactive device touching the touch surface. For example, a calibration can be performed to enable the processor 206 to differentiate between measurements associated with the interactive device hovering over the touch surface versus measurements associated with the interactive device touching the touch surface. The two-dimensional (x, y) coordinates of interactions within the plate can be estimated for both hover and touch. For example, the processor 206 can determine from the three-dimensional position information an (x, y) position for a hover point associated with the interactive device hovering above a projected point on the touch surface. The processor 206 can also determine from the two-dimensional position information an (x, y) position for a touch point associated with the interactive device touching the touch surface. The processor 206 can communicate the position of the interactive device with respect to the touch surface of the hover touch controller device 202 to the display device 204.

In some embodiments, the communication interface 216 of the hover touch controller device 202 is configured to transmit the three-dimensional position information associated with the interactive device hovering over the touch surface and two-dimensional position information associated with the interactive device touching the touch surface to a processor external to the hover touch controller device 202, such as processor 226. In certain embodiments the processor 226 can determine from the three-dimensional position information an (x, y) position for a hover point associated with the interactive device hovering above a projected point on the touch surface. The processor 226 can also determine from the two-dimensional position information an (x, y) position for a touch point associated with the interactive device touching the touch surface, the touch point having an offset from the hover point. In certain embodiments, the processor 226 can correct for an offset and cause a corrected position to be presented at the display device 204. That is, although the present disclosure will be described in conjunction with specific embodiments of processor 206, it will be understood that it is not the intention to limit the invention to the described embodiments. On the contrary, it is intended to cover alternatives, modifications, and equivalents as may be suggested to one skilled in the art within the scope of the appended claims.

Additionally, the (x, y) position for the touch point can be offset from the (x, y) position for the associated hover point. As such, the user may perceive a jump or offset between a hover point and the corresponding touch point, which may be due to differences in the sensing technologies used to determine hover interactions and touch interactions. Even further, the size of the misalignment may vary across the touch surface. For example, the magnitude of the misalignment may decrease as the interactive device moves towards the center of the touch surface and increase as the interactive device moves towards to edge of the touch surface.

In certain embodiments, communicating the position of the interactive device with respect to the touch surface to the display device 204 includes correcting for any perceived user interaction issues associated with the offset between the hover point and the touch point. For example, the processor 206 can communicate a corrected position for the touch point to the display device 204.

In some embodiments, the hover touch cursor may be used as part of a larger user interface scheme. For example, in certain embodiments, the hover touch cursor and tracking are utilized to provide the equivalent of direct spatial input on the remote display, where a direct spatial input means the user gets a visual feedback from the display of where their fingers are hovering and when and where they are about to touch. In essence, this is the equivalent to a direct spatial input on the remote display. In particular, the visual feedback for the hover mode makes the interaction as easy as directly interacting with a mobile device with multi-touch.

Figure 3:
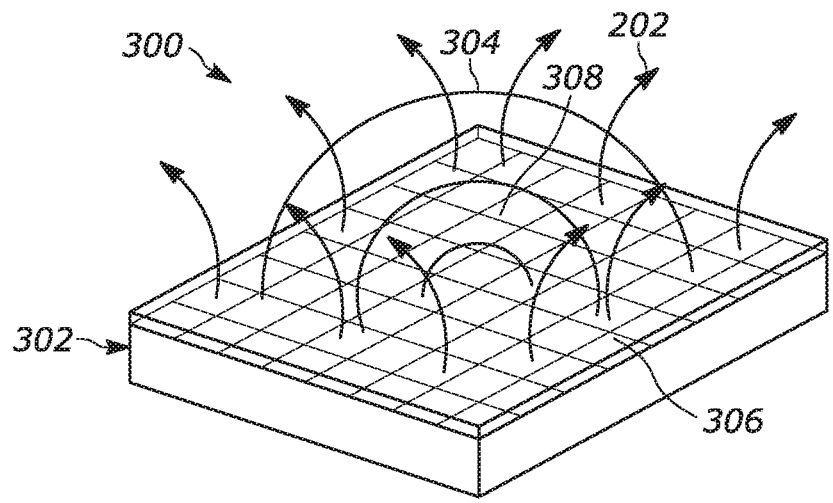
FIG. 3 illustrates an example of the hover touch controller device sensor fields according to embodiments of the present disclosure.

FIG. 3 illustrates an example of the sensor fields of hover touch controller device 202 according to embodiments of the present disclosure. The embodiment of the sensor fields 300 shown in FIG. 3 is for illustration only. Other embodiments could be used without departing from the scope of the present disclosure.

In the example shown in FIG. 3, an input sensor 302 is depicted. The input sensor 302 can be the same as, or included as part of, proximity sensor 212 or touch sensor 210. In certain embodiments, the input sensor 302 includes a two-dimensional rectangular plate or touch surface. The input sensor 302 further includes a proximity sensor or proximity sensing capability. The proximity sensor is configured to provide three-dimensional position information of an interactive device hovering over the touch surface 306. For example, the input sensor 302 can comprise a projected capacitive sensor configured to provide an electric field 304 around the touch surface 306, which when disturbed by the presence of the interactive device hovering over the touch surface 306, can be measured. That is, when an input device, such as a finger of the user, disturbs a hover area 308 over the input sensor 302, the input sensor 302 can detect and measure the disturbance caused by the input device. The input sensor 302 further includes a contact sensor or contact sensing capability. The contract sensor is configured to provide two-dimensional position information of the interactive device contacting the touch surface 306. For example, the input sensor 302 can comprise a projected capacitive sensor configured to provide an electric field over the touch surface, which when disturbed by the presence of the interactive device contacting the touch surface 306, can be measured.

Figure 4A:
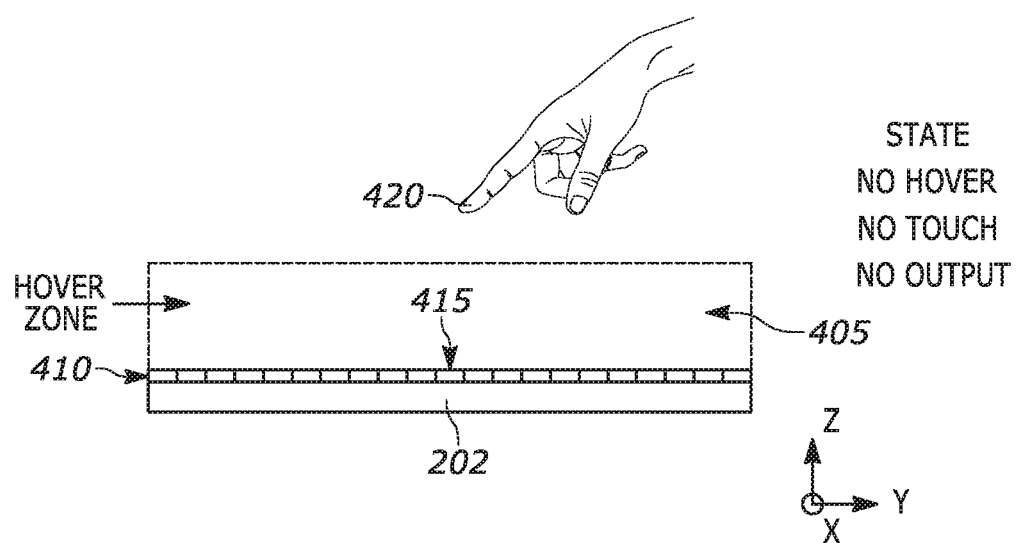
FIGS. 4A, 4B, and 4C illustrate examples of interaction states according to embodiments of the present disclosure.
Figure 4B:
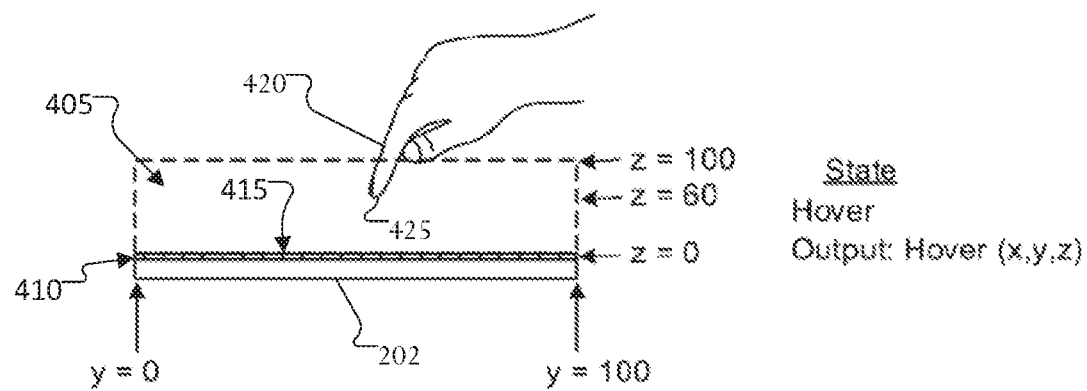
Figure 4C:
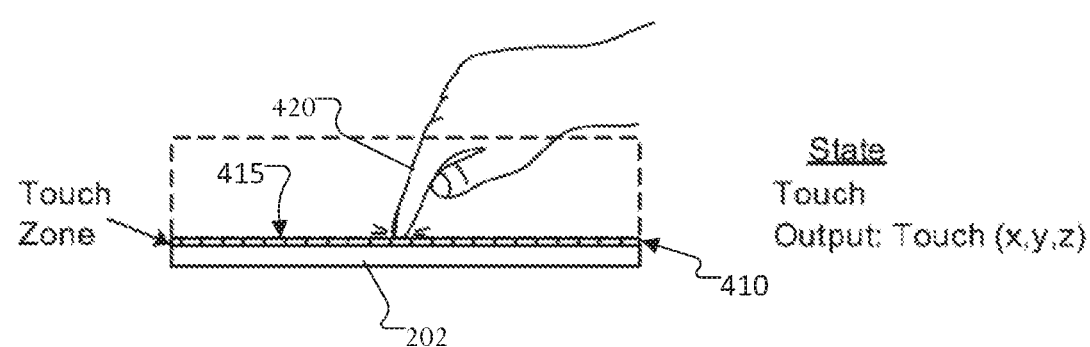

FIGS. 4A, 4B, and 4C illustrate examples of interaction states according to embodiments of the present disclosure. The embodiments of the interaction states shown in FIGS. 4A, 4B, and 4C are for illustration only. Other embodiments could be used without departing from the scope of the present disclosure.

A set of tracking and interaction states can be defined for the tracking and touch data of a hover touch controller device. In certain embodiments, an interaction space for the hover touch controller device 202 can be categorized into two zones: a hover zone 405 and touch zone 410. As used herein, a "hover zone" 405 (illustrated by dashed lines) is a volume above the surface 415 of the hover touch controller device 202. As used herein, a "touch zone" 410 is the surface of the hover touch controller device.

In the example shown in FIG. 4A, the interactive device 420, such as a finger of the user, is outside of the hover volume 405, which corresponds to a state in which there is no hover (no z data), no touch, and no output. In the example shown in FIG. 4B, the interactive device 420 is in the hover zone 405. Full 3D tracking is available within the volume of the hover zone 405 and the interactive device 420 can be tracked. Additionally, while in the hover zone 405, a position of the interactive device 420 is expressed in 3D coordinates as (x, y, z). The z value of the position of the interactive device 420 corresponds to a depth of the tip 425 of the interactive device 420 and, can be used to estimate the proximity of the tip 425 of the interactive device 420 to the touch surface 415. In the example shown in FIG. 4C, the interactive device 420 is in the touch zone 410, (z=0), which corresponds to the touch surface 415 of the hover touch controller device 202. In the touch zone 410, 3D tracking coordinates can be provided in the form (x, y, 0). Alternatively, 2D tracking coordinates could be provided in the form (x, y) because z=0.

It will also be understood that there are many distinct states of input for the hover touch controller device 202. In certain embodiments, the distinct states for hover touch controller device 202 can be categorized into seven input states, OUTSIDE, HOVER_ENTER, HOVER_MOVE, TOUCH_DOWN, TOUCH_MOVE, TOUCH_UP, and HOVER_EXIT. As used herein, the "OUTSIDE" state occurs when the interactive device is outside of the hover volume. As used herein, the "HOVER_ENTER" state occurs when the interactive device has just entered the hover volume. HOVER_ENTER is a discrete state and occurs only once in the transition from outside to inside the hover volume. As used herein, the "HOVER_MOVE" state occurs when the interactive device is moving around within the hover volume without touching the touch surface of the hover touch controller device. HOVER_MOVE is a continuous state occurring over multiple display frames. As used herein, the "TOUCH_DOWN" state occurs when the interactive device touches the touch surface of the hover touch controller device. TOUCH_DOWN is a discrete state and occurs only once in the transition from the hover volume to the touch zone. As used herein, TOUCH_MOVE occurs when the interactive device has TOUCH_DOWN and is moving across the touch surface of the hover touch device. TOUCH_MOVE is a continuous state occurring over multiple display frames. As used herein, the "TOUCH_UP" state occurs when the interactive device transitions between either the TOUCH_DOWN state or the TOUCH_MOVE state, and the HOVER_MOVE state. TOUCH_UP is a discrete state and occurs only once during the transition between touch and hover. As used herein, the "HOVER_EXIT" state occurs when the interactive device has just left the hover volume. HOVER_EXIT is a discrete state and occurs only once when the interactive device transitions from inside the hover volume to outside the hover volume.

In some embodiments, the hover touch controller device 202 can be used in combination with a head mounted display. In some embodiments, the hover touch device 202 can be connected to, attached to, or otherwise operated in combination with a head mounted display. For example, the hover touch device 202 may be collocated with, or disposed on or proximate to, the front face of a head mounted display. In certain embodiments, the hover touch controller device 202 is transparent, or substantially transparent, in order to enable it to be used with see through head mounted display. In some embodiments, the hover touch device 202 contains wireless modules and processing units of its own, which allows it to be detached from the head mounted display and used at hand level. For example, the processor 206 can transmit the position of the interactive device 420 wirelessly via a wireless interface such as BLUETOOTH, ZIGBEE, or WI-FI to the head mounted display.

In certain embodiments, the processor 206 coordinates the operation of the touch sensor 210 and proximity sensor 212 to generate information on the position of a user's finger relative to the touch surface 415. This may include determining from the two-dimensional (x, y) position information a position relative to the two dimensional surface of the touch surface 415 of the touch sensor 210, such as (x, y) information, indicating that the user's finger has touched the touch surface 415 of the touch sensor 210. This position may be called a "contact point". The processor 206 further determines, from the three-dimensional (x, y, z) position information, a position relative to the two dimensional surface of the touch surface 415 of the touch sensor 210, such as $(x^1, y^1)$ information, indicating that the user's finger is hovering above a point projected on the touch surface 415 of the touch sensor 210, this position may be called a "hover point". Thus, information is generated describing "touch" interactions and "hover" interactions.

Conventional hover touch controller devices exhibit issues with the user's input perception of the information generated. For example, when a user's finger hovers over an area and then touches down, the user may perceive a jump or offset between the hover point and the corresponding touch point. There are several reasons for this. One reason may be due to a difference in sensing technologies used to determine hover interactions and touch interactions, and to account for this difference in the design process. Responsive to the processor 206 determining the offset from the information describing the hover interactions and the touch interactions, the processor 206 modifies the information associated with the touch interaction(s). This information is communicated via a communication interface 216 to a display 204.

Figure 5:
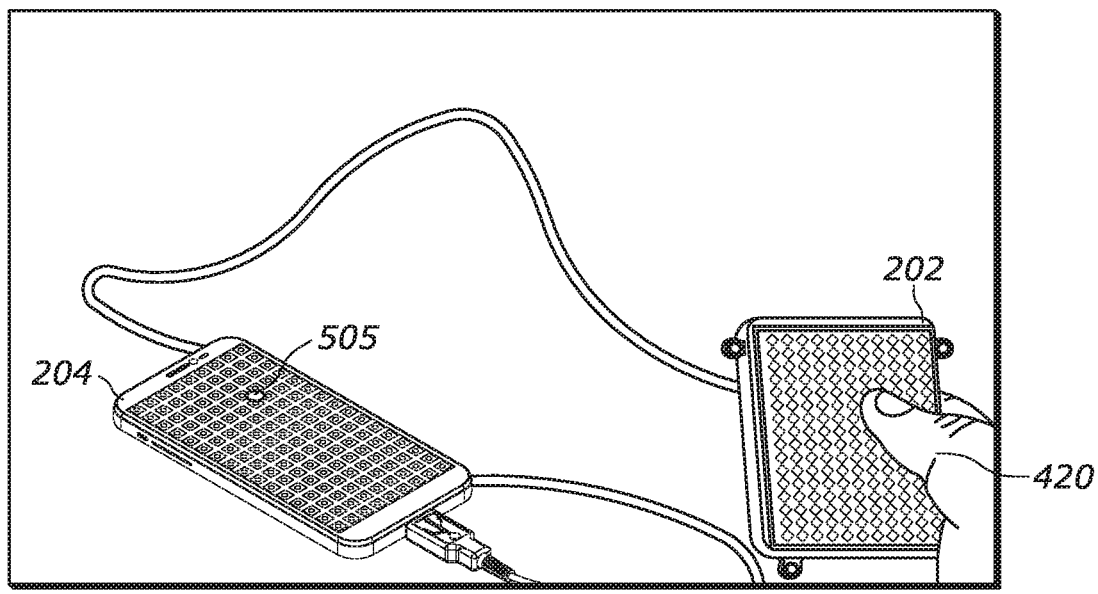
FIG. 5 illustrates an example of a sensed hover point according to embodiments of this disclosure.

FIG. 5 illustrates an example of a sensed hover point according to embodiments of the present disclosure. The embodiment of the sensed hover point shown in FIG. 5 is for illustration only. Other embodiments could be used without departing from the scope of the present disclosure.

In the example shown in FIG. 5, the interactive device 420 is a thumb of a user, which is hovering over a given location on the touch surface of the hover touch controller device 202. The three-dimensional position of the user's thumb (interactive device 420), with respect to the touch surface of the hover touch controller device 202, is communicated to a display device 204, namely a display of a handset. In the example shown in FIG. 5, the hover point 505 of the user's thumber is represented on the display device 204 by a circle. In certain embodiments, the hover point 505 may be represented by a circle of a specific colored. For example, as shown, the hover point 505 may be represented by a green circle on the display device 204. In the example shown in FIG. 5, a plurality of software keys are represented on the display device 204 by a grid pattern of rectangular boxes, and the hover point 505, represented by the colored hover circle, is positioned over a specific software key.

Figure 6:
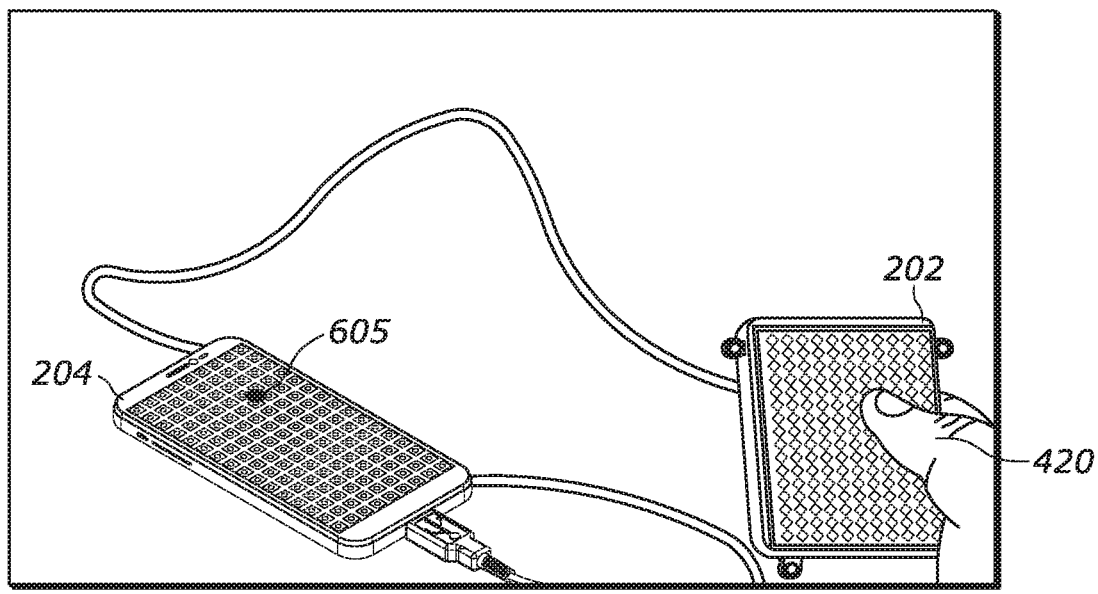
FIG. 6 illustrates an example of a sensed touch point according to embodiments of this disclosure.

FIG. 6 illustrates another example of a sensed touch point according to embodiments of the present disclosure. The embodiment of the sensed touch point shown in FIG. 6 is for illustration only. Other embodiments could be used without departing from the scope of the present disclosure.

In the example of FIG. 6, the user's thumb has touched down (touch point 605) on the touch surface at a location that the user perceives to correspond to the previous hover touch location 505 of FIG. 5. The two-dimensional position of the user's hovering thumb, with respect to the touch surface of the hover touch controller device 202, is being communicated to the display device 204. As shown in the example of FIG. 6, the touch point 605 is represented on the display device 204 by a circle. In certain embodiments, the touch point 605 may be represented by a circle of a specific colored. For example, the hover point 505 may be represented by a green circle while the touch point 605 can be represented by a red circle on the display device 204. In the example shown in FIG. 6, the touch point 605, represented by the colored circle, has move away from the specific software key over which the hover point 505 was previously positioned. This movement may be perceived by the user as a jump or offset between the hover point 505 and the corresponding touch point 605, and the misalignment in sensing may result in the user inadvertently activating an adjacent key.

Figure 7A:
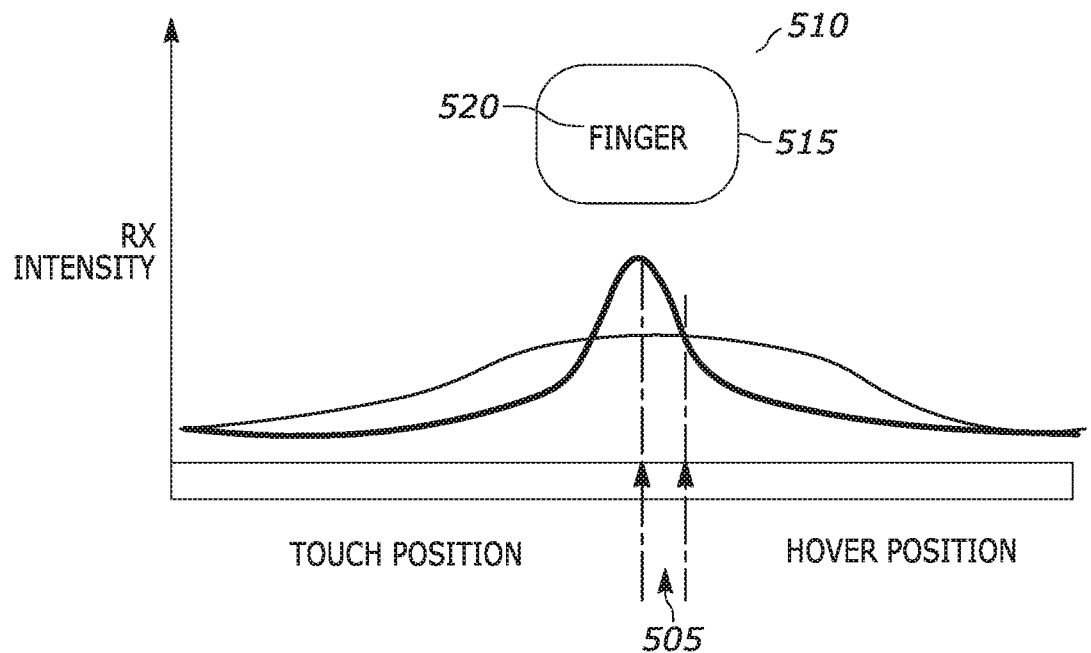
FIGS. 7A and 7B illustrate examples of hover-touch misalignments.
Figure 7B:
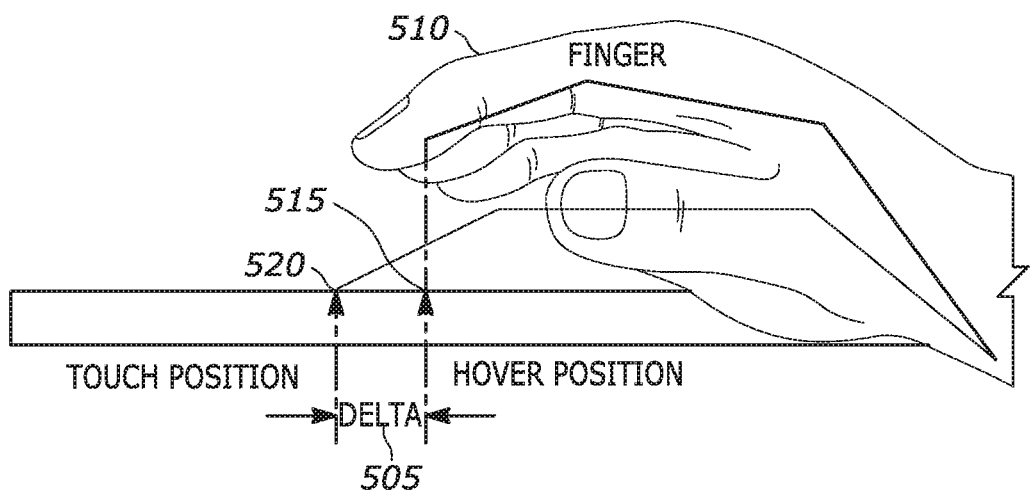

FIGS. 7A and 7B illustrate examples of hover-touch misalignments. The examples of the hover-touch misalignments shown in FIGS. 7A and 7B are for illustrates only and other examples could be used without departing from the scope of the present disclosure.

A hover-touch misalignment 705 may be result from differences in the sensing technologies used to determine hover interactions and touch interactions. For example, when a finger 510 enters a hover region, such as at hover position 515 (also referred to as hover point), the finger generates a constantly changing 3D disturbance in the projected capacitive field, which is not limited to just the tip of the finger 510. For the processor to determine the hover position 515, the processor must employ an algorithm to identify what point in the constantly changing 3D disturbance probably corresponds to the tip of the finger 510. In certain embodiments of the present disclosure, the algorithm executed by the processor 206 equates the centroid of the changing 3D disturbance as being the tip of the finger 510, which in some instances can also be referred to as an anchor point or a point of interaction.

In contrast to the constantly changing 3D disturbance of a hovering finger, a finger 510 that comes into direct contact with the touch surface, such as at touch position 520 (also referred to as a touch point), generates a 2D surface disturbance in the projected capacitive field, which is substantially static and limited to the tip of the finger 510. For the processor to determine the contact point, namely touch position 520, the processor employs a different algorithm, which in contrast to the hover point algorithm, merely has too estimate the epicenter of the 2D surface disturbance corresponding to the tip of the finger 510. These differences, the ambiguity of estimating the centroid of a constantly changing 3D disturbance, versus the relative certainty with which the epicenter of substantially static 2D disturbance can be determined, can contribute to the misalignment 705 between the hover point 515 location and the touch point 520 location. There may be other differences between these two sensing technologies that further contribute to the misalignment 705. For example, the respective Signal to Noise Ratio (SNR), physical design constraints, and the relative maturity of the two different sensing technologies, may be different. In certain embodiments, the processor 206 is configured to correct for a misalignment 705 that is the result of the two different sensing technologies utilized.

Other reasons, unrelated to the different sensing technologies, may be the cause for the misalignment 705. For example, the human body is not a precision mechanism, and an appendage, such as a finger 510, is not designed to perform precision operations. Therefore, while the user may be under the perception that the tip of their finger 510 is transitioning from a hover position 515 to a contact touch position 520 vertically (0, 0, z) below the hover position 515, because of the finger 510 is composed of series of links and articulating joints, there may be some movement in the horizontal plane (x, y) that contributes to the misalignment 705 between the hover position 515 and the touch position 520. In certain embodiments, the processor 206 is configured to correct for a misalignment 705 that is the result of the series of kinematic links in the human finger 510.

The size of the misalignment 705 may also vary across the touch surface. For example, a magnitude of the misalignment 705 may decrease as the interactive device moves towards the center of the touch surface and increase as the interactive device moves towards to edge of the touch surface. Even further, the perceived misalignment may be easier for the user to perceive if the size of the touch surface and the display are different. For example, if the hover touch controller device 202 is operated as an absolute interaction device, the perceived misalignment will be greater if the size of the interactive surface of the GUI design is significantly larger than the size of the touch surface.

Figure 8:
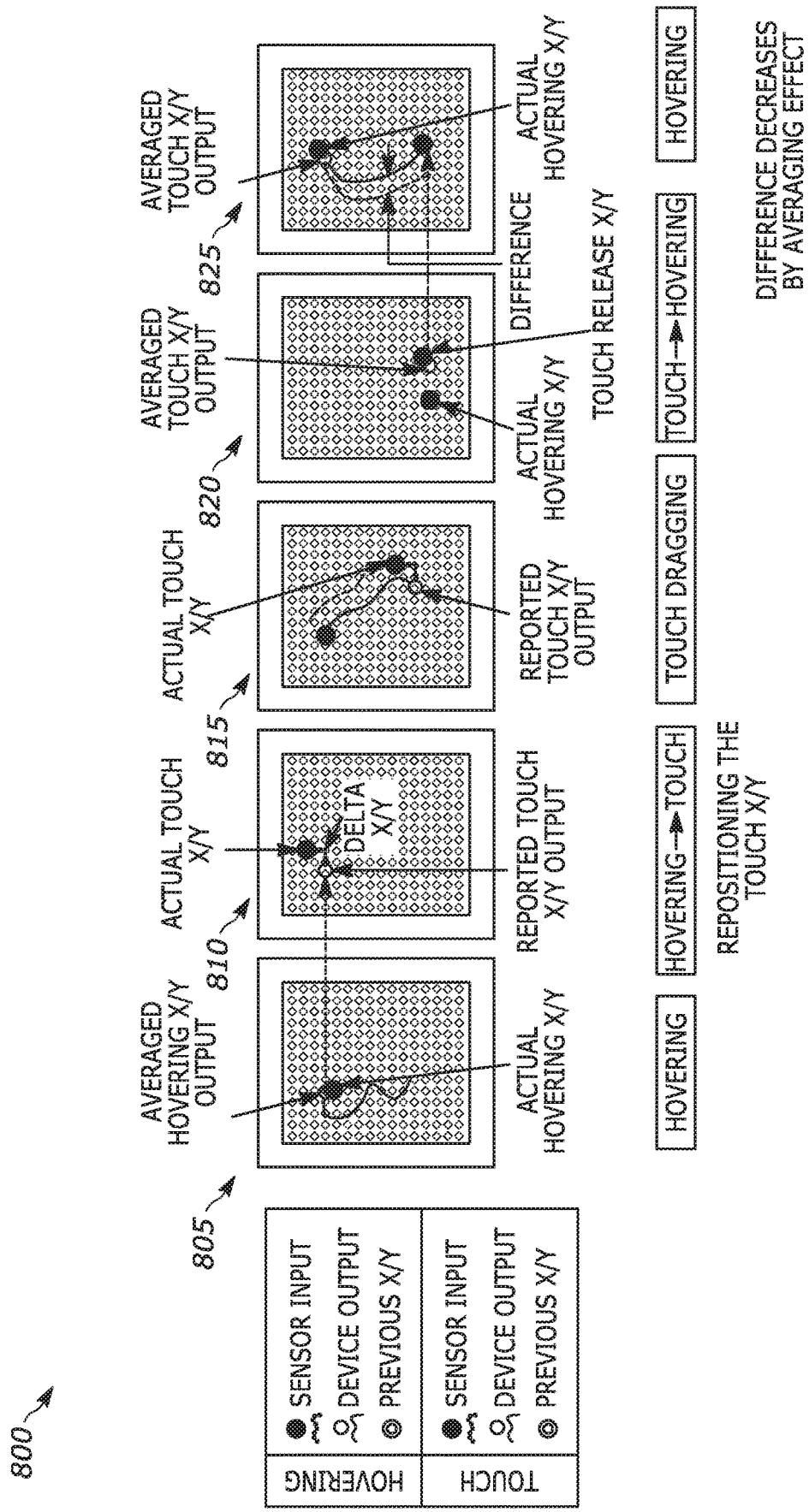
FIG. 8 illustrates examples of a HOVER and TOUCH states according to embodiments of this disclosure.

FIG. 8 illustrates HOVER and TOUCH states 800 according to embodiments of the present disclosure. The embodiment of the HOVER and TOUCH states 800 shown in FIG. 8 is for illustration only. Other embodiments could be used without departing from the scope of the present disclosure.

As shown in FIG. 8, in a HOVER_MOVE state 805, the user's finger is moving around within the hover volume generating a constantly changing 3D disturbance in the projected capacitive field of the proximity sensor 212. The proximity sensor 212 is configured to provide three-dimensional position information related to the constantly changing 3D disturbance to the processor 206. The processor 206 determines, using an algorithm stored in memory 208, a three-dimensional position (x, y z) in the constantly changing 3D disturbance that corresponds to the tip of the user's finger. The processor 206 further determines from the (x, y, z) position information a hover point having an (x_h, y_h) position projected on the touch surface of the hover touch controller device 202.

In some embodiments, the processor 206 continually stores the (x_h, y_h) positions for the hover point in a queue or data buffer, such as in memory 208. For example, the processor 206 may store the (x_h, y_h) positions in a First In, First Out (FIFO) queue of size n frames, where the oldest hover point entry is discharged first. In certain embodiments, the processor 206 determines the current hover point location based on a running average of a plurality of stored frames. For example, the processor 206 can determine the current hover point location based on an average of last n frames, where the average is the mean, mode, or medium, or the like, of the last n frames. In certain embodiments, the queue size (n) is about 10 frames. In certain embodiments, the queue size (n) is about 20 frames. In certain embodiments, the queue size (n) is between 10 frame and 20 frames. In certain embodiments, the frame rate is about 60 frames per second. In certain embodiments, the frame rate is about 120 frames per second. In some embodiments, the running average is based on a period of time. In certain embodiments, the period of time is less than a second. In certain embodiments, the period of time is about 125 ms. In certain embodiments, the period of time is between about 80 ms and about 340 ms. In certain embodiments, the queue size (n) is determined, such that the user does not perceive a lag in the response of the current hover point location to a real-time input from the user. By averaging a series of stored (x_h, y_h) positions, the processor 206 can eliminate the impact of spurious readings associated with noise, and the like, that may otherwise cause the hover point position to jitter.

$$x_{OUT}, y_{OUT} = \frac{\sum_{i=n}^{n+N} x_{h(i)}}{N}, \frac{\sum_{i=n}^{n+N} x_{h(i)}}{N} \tag{1}$$

In the above Equation 1, ($x_{OUT}$, $y_{OUT}$) is the calculated hover point position in Hover Mode and N indicates the average window size.

During a transition from a HOVER_MOVE state 805 to a TOUCH_DOWN state 810, the user's finger has substantially stopped moving around within the hover volume after aligning with a target point on the display. The user then attempts to touch the touch surface at a touch point directly below their finger by moving their finger only in the z-axis down towards the touch surface. In some embodiments, the processor 206 stores the last tracked (x_h, y_h) hover point or (x_h, y_h, 0_h) position in response to detecting that the finger has touched the touch surface. The processor 206 also can determine, in real-time, using the two-dimensional position information of the touch sensing system, a (x_t, y_t) touch point corresponding to the position of the user's finger on the touch surface. Because of the different sensing technologies used to determine hover interactions and touch interactions there will be an offset between the stored (x_h, y_h) position for the hover point and the real-time (x_t, y_t) position for the touch point. The size of the offset may further vary across the touch surface. For example, the magnitude of the offset may decrease as the user's finger moves towards the center of the touch surface and increase as the user's finger moves towards to edge of the touch surface. In certain embodiments, the processor 206 determines the magnitude of the offset based on a stored (x_h, y_h) position for the hover point and a real-time (x_t, y_t) position for the touch point. For example, the processor 206 can calculate the magnitude or vector of the offset by subtracting the real-time (x_t, y_t) position for the touch point from the stored (x_h, y_h) position for the hover point. In certain embodiments, the processor 206 is further configured to perform offset correction in response to detecting the finger touching the touch surface. That is, the offset correction is applied to, or starting at, the TOUCH_DOWN state 810.

$$d_x, d_y = \frac{\sum_{i=n}^{n+N} x_{h(i)}}{N} - x_t, \frac{\sum_{i=n}^{n+N} x_{h(i)}}{N} - y_t \tag{2}$$

In the above Equation 2, ($d_x$, $d_y$) indicates the offset correction at the transient moment from HOVER_MOVE to TOUCH_MOVE.

A touch dragging occurs in a TOUCH_MOVE state 815 wherein the user's finger has completed the transition from the HOVER_MOVE state 805 to TOUCH_DOWN state 810 and the magnitude of the offset between the stored (x_h, y_h) position for the hover point and the corresponding (x_t, y_t) position for the touch point has been calculated. As illustrated in FIG. 8, the user's finger is moving across the touch surface within the touch volume generating a constantly changing 2D disturbance in the projected capacitive field of the touch sensor. That is, the user's finger is moving across the touch surface of the hover touch device in a TOUCH_MOVE state 805.

In certain embodiments, a correction may be applied to the sensed touch (x_t, y_t) position of the user's finger. For example, the offset may be added to the sensed touch (x_t, y_t) position, which may also to referred to as the actual touch (x_t, y_t) position to obtain a virtual touch (x, y) position, which may also be referred to as a reported touch (x, y) position. The reported touch (x, y) position is therefore equivalent to the touch (x, y) position if reported by the hover sensing system. By applying an offset to the sensed touch (x_t, y_t) position any jump that the user may otherwise perceive, between the hover point and the corresponding touch point, which may be due to differences in the sensing technologies used to determine hover interactions and touch interactions, can be eliminated. TOUCH_MOVE is a continuous state occurring over multiple frame. In some embodiments the offset is applied across multiple frames to the sensed touch (x_t, y_t) position. That is, as the user drags their finger across the touch surface, this offset correction continues to be applied to the actual touch (x_t, y_t) position to obtain a virtual touch (x, y) position that is continually corrected. That is, the offset is applied stating with the TOUCH_DOWN state 810 itself and continues to be applied in the TOUCH_MOVE state 815.

$$x_c, y_c = x_t + d_x, y_t + d_y \qquad (3)$$

In the above Equation 3, $(x_c, y_c)$ is the corrected position in TOUCH_MOVE.

In a TOUCH_UP state 820, in which a touch-hovering occurs, the user's finger has transitioned from the TOUCH_MOVE state 815 to the TOUCH_UP state 820. That is, the user has completed the touch operation and has proceeded to lift their finger from the touch surface. In some embodiments, the processor 206 determines, in real-time, the last actual touch (x_t, y_t) position for this location, which may also be referred to as the touch release x_t, y_t position. The processor 206 can further store the touch release x_t, y_t position in the FIFO queue or data buffer that was previously used to store (x_h, y_h) positions for the hover point. In certain embodiments, the processor 206 further clears the stored (x_h, y_h) positions for the hover point, prior to storing this touch release x_t, y_t position, such that, the touch release x_t, y_t position is the only entry stored in the FIFO queue.

In a second HOVER_MOVE state 825, after the TOUCH_UP state 820, the user's finger begins to move within the hover volume and the hover sensing system being reporting and storing hover (x_h, y_h) positions. Initially, there may be a discrepancy between the stored touch release x_t, y_t position and the initial hover (x_h, y_h) position. It is noted that the user may not perceive this discrepancy, in part, because TOUCH_UP states 820 are not normally associated with precision hover touch controller device 202 interactions. That is, the user does not perceive the discrepancy because the user does not perform any user interactions, or user interface inputs, of significance in the TOUCH_UP state 820. Even further, as the processor 206 continues to store (x_h, y_h) positions for the hover point in the FIFO queue this discrepancy will become increasing less significant until n frames of hover (x_h, y_h) positions have been stored and the stored touch release (x_t, y_t) is no longer part of the running average for the hover point position. That is, the user will not perceive the discrepancy on TOUCH_UP because the discrepancy is rapidly corrected for in just n frames.

Figure 9:
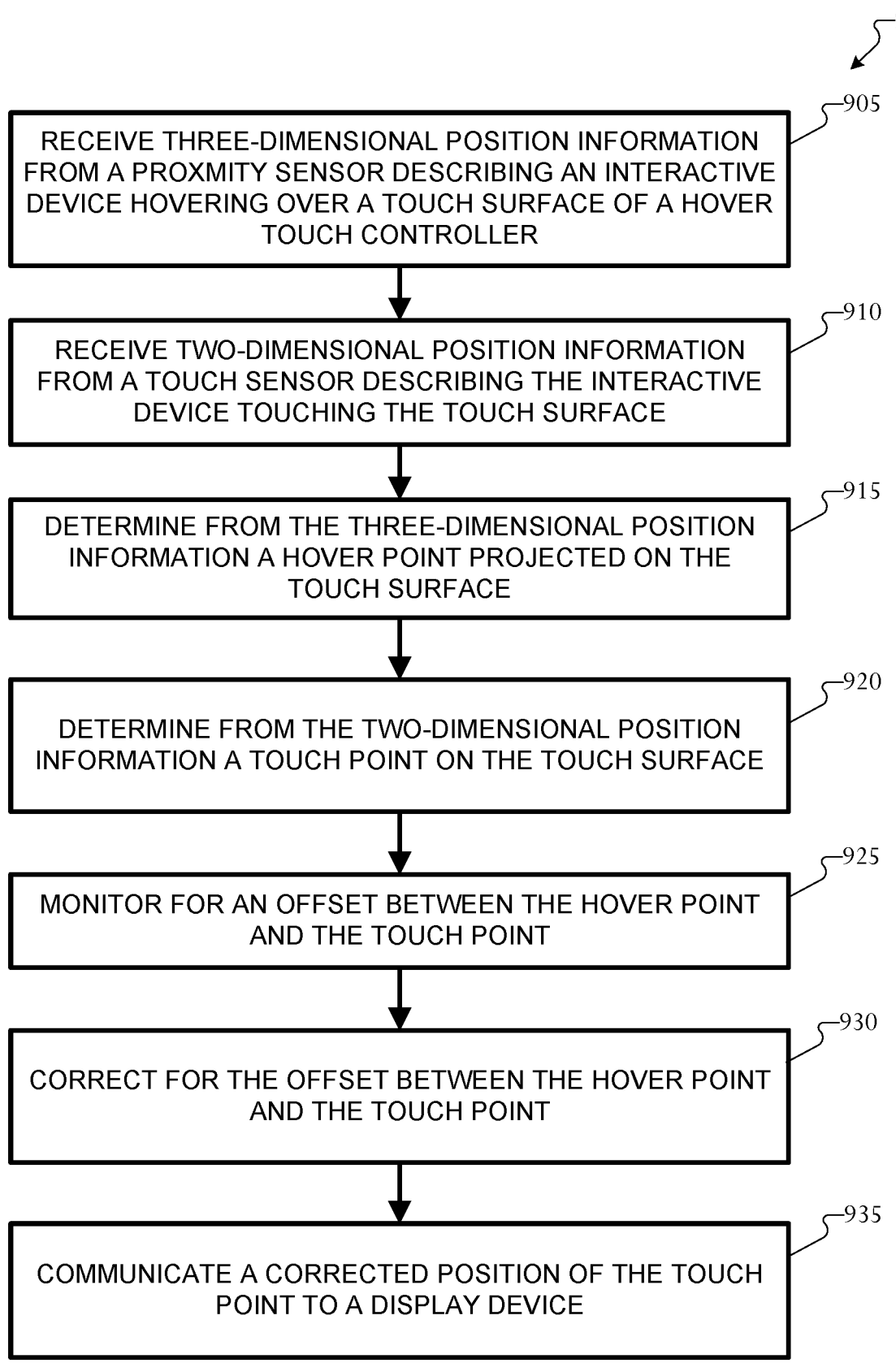
FIG. 9 illustrates operations of a process for correcting for perceived user interaction issues associated with an offset between a hover point and a touch point of a hover touch controller device according to embodiments of the present disclosure as may be performed by a processor.

FIG. 9 illustrates a process 900 for correcting for perceived user interaction issues associated with an offset between a hover point and a touch point of a hover touch controller device according to embodiments of the present disclosure as may be performed by a processor. While the flow chart depicts a series of sequential steps, unless explicitly stated, no inference should be drawn from that sequence regarding specific order of performance, performance of steps or portions thereof serially rather than concurrently or in an overlapping manner, or performance of the steps depicted exclusively without the occurrence of intervening or intermediate steps. The process depicted in the example depicted is implemented by a processor in, for example, a hover touch controller device 202.

In block 905, the processor receives three-dimensional position information from a proximity sensor describing an interactive device hovering over a touch surface of a hover touch controller device. In block 910 the processor receives two-dimensional positional information from a touch sensor describing the interactive device touching the touch surface. Subsequently, the processor, in block 915 determines from the three-dimensional position information a hover point projected on the touch surface. In some embodiments, the determining of the hover point from the three-dimensional position includes a real-time averaging of (x, y) positions for the hover point or a stored (x, y) position for the touch point. The processor determines from the two-dimensional position information a touch point on the touch surface in block 920. The processor, in block 925, monitors for an offset between the hover point and touch point. In block 930, the processor, in response to identifying that the touch point is offset from the hover point corrects for the offset. In some embodiments, correcting for the offset is responsive to the processor detecting that the interactive device is touching the touch surface. In some embodiments, correcting for the offset includes using a magnitude based on a stored (x, y) position for the hover point and a real-time (x, y) position for the touch point. Subsequently, in block 935, the processor communicates a corrected position of the touch point to a display device. In some embodiments, communicating the corrected position of the touch point includes representing on the display the corrected position with a cursor.

Although the present disclosure has been described in conjunction with specific embodiments, it will be understood that it is not it is not the intention to limit the invention to the described embodiments. On the contrary, it is intended to cover alternatives, modifications, and equivalents as may be suggested to one skilled in the art as fall within the scope of the appended claims. The present invention may be practiced without some or all of these specific details. In addition, well known features may not have been described in detail to avoid unnecessarily obscuring the invention.

In accordance with the present invention, the components, process steps, and/or data structures may be implemented using various types of operating systems, programming languages, computing platforms, computer programs, and/or computing devices. In addition, those of ordinary skill in the art will recognize that devices such as hardwired devices, field programmable gate arrays (FPGAs), application specific integrated circuits (ASICs), or the like, may also be used without departing from the scope and spirit of the inventive concepts disclosed herein. The present invention may also be tangibly embodied as a set of computer instructions stored on a computer readable medium, such as a memory device.

None of the description in this application should be read as implying that any particular element, step, or function is an essential element that must be included in the claims scope. The scope of patented subject matter is defined only by the claims. Moreover, none of the claims are intended to invoke 35 U.S.C. § 112(f) unless the exact words "means for" are followed by a participle.

What is claimed is:
1. An apparatus comprising:
a touch surface;
a proximity sensor configured to provide three-dimensional position information associated with an interactive device hovering over the touch surface;
a touch sensor configured to provide two-dimensional position information associated with the interactive device touching the touch surface; and
a processor configured to:
determine, from the three-dimensional position information, a hover point projected on the touch surface;

determine from the two-dimensional position information a touch point;
identify an offset between the touch point and the hover point previously projected on the touch surface; and
correct for the offset and communicate a corrected position of the touch point to a display device, wherein the processor adds a magnitude and vector of the offset to the touch point as the interactive device is moved across the touch surface, wherein the magnitude and vector of the offset comprises a difference of a coordinate of the touch point and a coordinate of the hover point.

2. The apparatus of claim 1, wherein the processor is configured to perform offset correction in response to detecting the interactive device touching the touch surface.

3. The apparatus of claim 1, wherein the processor is configured to perform offset correction using a magnitude based on a stored (x, y) position for the hover point and a real-time (x, y) position for the touch point.

4. The apparatus of claim 1, wherein the hover point is based on a real-time averaging of (x, y) positions for the hover point or a stored (x, y) position for the touch point.

5. The apparatus of claim 1, wherein the corrected position is represented by a cursor on the display device.

6. A method comprising:
receiving three-dimensional position information from a proximity sensor describing an interactive device hovering over a touch surface of a hover touch controller;
receiving two-dimensional position information from a touch sensor describing the interactive device touching the touch surface;
determining from the three-dimensional position information a hover point projected on the touch surface;
determining from the two-dimensional position information a touch point on the touch surface;
monitoring for an offset between the hover point and the touch point; and
responsive to identifying the touch point being offset from the hover point:
correcting for the offset, and
communicating a corrected position of the touch point to a display device, wherein a magnitude and vector of the offset are added to the touch point as the interactive device is moved across the touch surface, wherein the magnitude and vector of the offset comprises a difference of a coordinate of the touch point and a coordinate of the hover point.

7. The method of claim 6, wherein correcting for the offset is in response to detecting that the interactive device is touching the touch surface.

8. The method of claim 6, wherein correcting for the offset includes using a magnitude based on a stored (x, y) position for the hover point and a real-time (x, y) position for the touch point.

9. The method of claim 6, wherein determining the hover point from the three-dimensional position information includes a real-time averaging of (x, y) positions for the hover point or a stored (x, y) position for the touch point.

10. A computer program product residing on a non-transitory computer-readable storage medium having a plurality of instructions stored thereon which, when executed by a processor, cause the processor to perform operations comprising:
receiving three-dimensional position information from a proximity sensor describing an interactive device hovering over a touch surface of a hover touch controller;
receiving two-dimensional position information from a touch sensor describing the interactive device touching the touch surface;
determining from the three-dimensional position information a hover point projected on the touch surface;
determining from the two-dimensional position information a touch point on the touch surface;
monitoring for an offset between the hover point and the touch point; and
responsive to identifying the touch point being offset from the hover point:
correcting for the offset, and
communicating a corrected position of the touch point to a display device, wherein a magnitude and vector of the offset are added to the touch point as the interactive device is moved across the touch surface, wherein the magnitude and vector of the offset comprises a difference of a coordinate of the touch point and a coordinate of the hover point.

11. The computer program product of claim 10, wherein correcting for the offset is in response to detecting that the interactive device is touching the touch surface.

12. The computer program product of claim 10, wherein correcting for the offset includes using a magnitude based on a stored (x, y) position for the hover point and a real-time (x, y) position for the touch point.

13. The computer program product of claim 10, wherein determining the hover point from the three-dimensional position information includes a real-time averaging of (x, y) positions for the hover point or a stored (x, y) position for the touch point.

14. The computer program product of claim 10, wherein communicating a corrected position of the touch point includes representing on the display device the corrected position with a cursor.

15. A device comprising:
a proximity sensor configured to provide pre-touch information corresponding to a first location on a touch surface over which an interactive device is hovering;
a touch sensor configured to provide touch position information corresponding to a second location at which the interactive device touches the touch surface; and
a processor configured to:
determine, at a first time instance, a hover point projected on the touch surface, the hover point corresponding to the first location;
determine, at a second time instance subsequent to the first time instance, a touch point, the touch point corresponding to the second location;
identify an offset between the touch point and the hover point; and
correct for the offset and communicate a corrected position of the touch point to a display device, wherein the processor continues to correct for a magnitude and vector of the offset to the touch point as the interactive device is moved across the touch surface, wherein the magnitude and vector of the offset comprises a difference of a coordinate of the touch point and a coordinate of the hover point.

16. The device of claim 15, wherein the processor is configured to perform offset correction in response to detecting the interactive device touching the touch surface.

17. The device of claim 15, wherein the processor is configured to perform offset correction using a magnitude based on a stored (x, y) position for the hover point and a real-time (x, y) position for the touch point.

18. The device of claim 15, wherein the hover point is based on a real-time averaging of (x, y) positions for the hover point or a stored (x, y) position for the touch point.

19. The device of claim 15, wherein the corrected position is represented by a cursor on the display device.

\* \* \* \* \*